United States Patent [11] 3,611,208

[72] Inventor Paul Zuk
Allentown, Pa.
[21] Appl. No. 5,241
[22] Filed Jan. 23, 1970
[45] Patented Oct. 5, 1971
[73] Assignee Bell Telephone Laboratories, Incorporated
Berkeley Heights, N.J.

[54] ANALOG TO DIGITAL CODE CONVERTER USING MICROPLASMA DIODE
9 Claims, 3 Drawing Figs.

[52] U.S. Cl. 332/9, 307/318, 332/52
[51] Int. Cl. H03k 7/08
[50] Field of Search 332/1, 9, 9 T, 10, 11, 52, 30 V; 307/285, 318; 325/105

[56] References Cited
UNITED STATES PATENTS

| | | | |
|---|---|---|---|
| 2,964,655 | 12/1960 | Mann | 307/318 |
| 3,187,273 | 6/1965 | Chasek | 332/9 X |
| 3,209,279 | 9/1965 | Kambouris | 331/78 |
| 3,382,463 | 5/1968 | Hurtig | 332/30 V |
| 3,457,469 | 7/1969 | Lawrence | 331/78 X |

*Primary Examiner*—Alfred L. Brody
*Attorneys*—R. J. Guenther and Arthur J. Torsiglieri

ABSTRACT: A diode that conducts current by the microplasma effect is used as an analog modulation to pulse code modulation converter. The analog signal is superimposed on a constant reverse-bias diode current to give a modulated microplasma pulsed output from the diode. This output, in the form of constant amplitude pulses of varying width and frequency, is converted back to the original analog signal by a low-pass filter.

PATENTED OCT 5 1971 3,611,208

INVENTOR
P. ZUK
BY
ATTORNEY

ANALOG TO DIGITAL CODE CONVERTER USING MICROPLASMA DIODE

BACKGROUND OF THE INVENTION

This invention relates to signal transmitting systems and, more particularly, to pulse code modulation (PCM) systems.

In accordance with known principles of pulse code modulation, information can be electrically transmitted in the form of a train of equal amplitude pulses. This method is particularly advantageous in overcoming the effects of nonlinear attenuation because faithful detection of the information requires only that the presence or absence of pulses be detected. Moreover, a pulse code can be amplified with fidelity by a two-level (on-and-off) amplifier.

The paper by K.G. McKay "Avalanche Breakdown in Silicon" Physical Review, Vol. 94, No. 4, May 15, 1954, pages 877–884, describes a diode conduction phenomenon now known as the microplasma effect. When a diode is reverse biased to a point near avalanche breakdown, it first begins to conduct low currents in small filaments known as microplasmas. Each of these microplasma filaments conducts current as constant amplitude pulses. It can be shown that, if the reverse current through the diode is limited to a value which is lower than the amplitude of these pulses, then only a single microplasma filament will be formed. The integrated sum of the pulsed current transmitted through the diode will then be equal to the current supplied by the source.

SUMMARY OF THE INVENTION

In accordance with my invention, a microplasma diode is used as an analog-to-digital code converter. The diode is reverse biased by a constant current source that supplies a sufficiently low current to prevent the formation of more than a single microplasma. In the absence of any modulation, the diode will generate output pulses having an integrated current value equal to the constant current supplied by the source.

An analog current signal to be converted to a pulse code is superimposed on the constant current supplied by the source. As will be explained more fully later, the duration and frequency of the microplasma pulsed output is modulated by the varying amplitude of the analog signal. Since the output pulses are of constant amplitude, they can be transmitted and processed as any pulse code and can be regenerated by a two-level amplifier. The pulse code can then be converted back to the original analog signal by simply passing it through a low-frequency band-pass filter, as will be explained later.

These and other objects of the invention will be better understood from a consideration of the following description taken in conjunction with the accompanying drawing.

DRAWING DESCRIPTION

DETAILED DESCRIPTION

Figure 1:
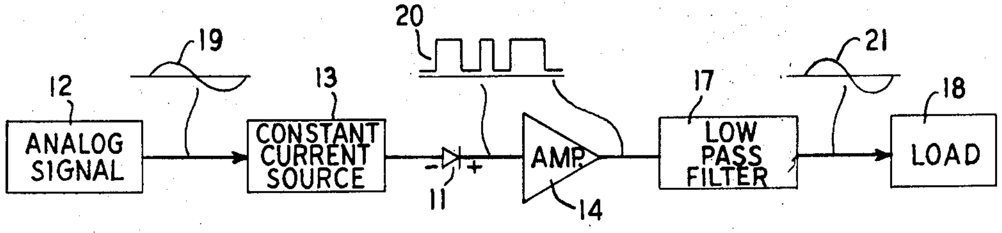
FIG. 1 is a schematic diagram of a circuit illustrating pulse code modulation in accordance with the invention.

Referring now to FIG. 1 there is shown a reverse-biased solid-state diode 11 used for converting an analog signal from a source 12 to a pulse code signal. The diode is reverse biased to microplasma conduction by a constant current source 13. The output PCM signal is directed through an amplifier 14 and then to a transmission system, not shown, which may typically comprise a number of amplifiers or repeaters. Eventually, it is delivered to a load 18 by way of a low pass filter 17 which converts the pulse code back to an analog signal. Curve 19 illustrates the analog signal delivered by signal source 12, curve 20 shows the signal after it has been converted to a pulse code by diode 11, and curve 21 shows the reconstituted analog signal.

My analog-to-digital code converter makes use of the observation that, when a diode is reverse biased to a point near avalanche breakdown, it first begins to conduct low currents in small microplasma filaments. Each of these filaments conducts current as constant amplitude pulses. As long as the reverse current to the diode is limited to a value lower than the amplitude of these pulses, then only a single microplasma filament will be formed and the integrated sum of the pulse current transmitted by the diode will be equal to the current supplied to the diode.

The current supplied to the diode is, of course, modulated by the analog signal 19, and as a result, the integrated sum of the pulsed current transmitted by the diode is modulated by the analog signal. Care must be taken, however, to assure that the analog signal does not cause the formation of two or more microplasma filaments. This is done by making the sum of the maximum analog signal current and the bias current smaller than the microplasma pulse current amplitude.

Figure 2:
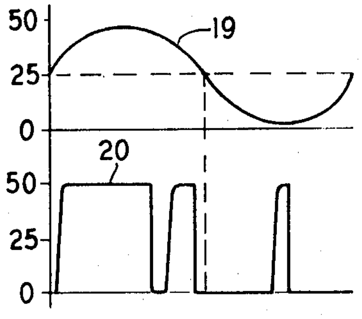
FIG. 2 is graphs illustrating the analog signal and pulse signal of the circuit of FIG. 1.

Referring to FIG. 2, for example, the amplitude of the output pulses as shown by curve 20 may typically be 50 microamps, the constant current from the direct current source 13 may be designed to be 25 microamps, and the analog signal as shown by curve 19 is chosen to have a maximum amplitude of 25 microamps, so that the total current supplied to the diode varies between 0 and 50 microamps.

The total output current from the diode is equal to the total input current to the diode so that the area under curve 20 must be equal to the area under curve 19. The width and frequency of the output pulses are therefore modulated by the analog signal component; for example, curve 20 shows that a greater pulse current is generated during the positive half cycle of the analog signal of curve 19 than during the negative half cycle.

The advantage of converting an analog signal to the pulse signal shown by curve 20 is that the pulse signal can be amplified by a two-level (on-and-off) amplifier. The pulse can be repeatedly amplified in any appropriate transmission system by merely regenerating all pulses to an appropriately high amplitude rather than maintaining amplitude differences as is necessary in an AM system.

After transmission, the original signal is restored simply by means of the low-pass filter 17. Filter 17 passes low frequencies within the bandwidth $\Delta f$ of the analog signal, but will not pass high-frequency components of the pulse train. If the analog signal is an audio frequency, the low-pass filter may be a loudspeaker which will not respond to the high-frequency pulses but will follow the average of audiofrequencies it receives. It could also be a transmission line that attenuates the pulse frequencies but passes the lower frequencies received in modulation.

Most semiconductor diodes manifest the microplasma conduction effect and may be used as the diode 11. It is, of course, preferable to use a diode having a determinable threshold of microplasma conduction and a reasonably large current range in which modulation can occur. Platinum-silicide Schottky barrier diodes have been found to be suitable and are additionally advantageous in that they are compatible with beam lead monolithic integrated circuit technology.

Figure 3:
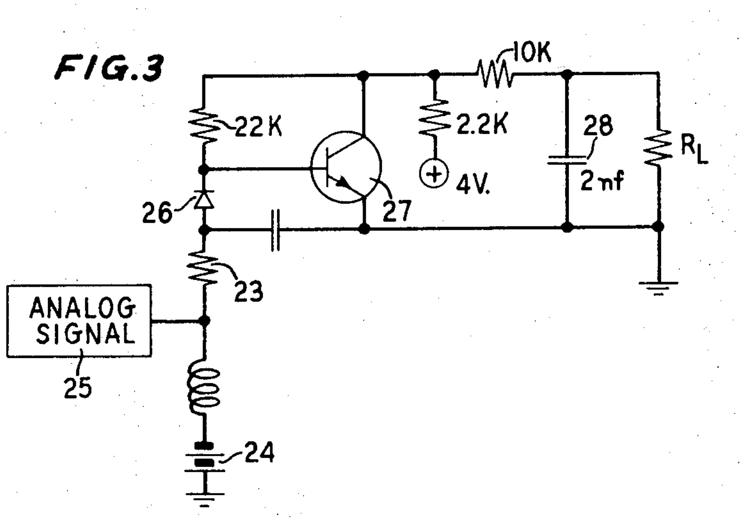
FIG. 3 is a schematic circuit showing in more detail the components of the FIG. 1 circuit.

FIG. 3 shows a typical embodiment of the invention for use with audiofrequencies. The 100 kilohm resistor 23 in conjunction with battery 24 approximates a constant current source which is modulated by the analog signal from source 25. The diode 26 generates a pulse output that is amplified by a transistor 27. The capacitor 28 and 10K resistor act as a high-frequency filter for converting the digital signal back to the analog signal which is delivered to the load $R_L$. The letters K represent kilohms and nf denotes nanofarads. The values shown are suitable for use with typical 50 microamp digital current pulses. The circuit may be used with analog signals having a frequency on the order of 1 kilocycle. The constant current source could alternatively be a transistor with bias regulation such as to produce the nominal current at any working temperature.

Various other embodiments and modifications may be made by those skilled in the art without departing from the spirit and scope of the invention.

What is claimed is:

1. An analog-to-digital code converter comprising:

a diode of a type capable of conducting current by the microplasma effect;

means comprising a substantially constant current source for reverse biasing the diode at a voltage above the threshold required for microplasma current conduction;

and means for superimposing on the current supplied by said constant current source an analog signal current to be converted to a pulse code.

2. The code converter of claim 1 wherein:

the microplasma effect is characterized by the conduction of current pulses through said diode of a first predetermined amplitude; and, the amplitude of the signal current superimposed on the current supplied by the constant current source is lower than said predetermined amplitude.

3. The code converter of claim 2 wherein:

the reverse-bias current through the diode is maintained at all times at a sufficiently low value to preclude the formation of more than one microplasma filament.

4. The code converter of claim 3 wherein:

the diode is a platinum-silicide Schottky barrier diode.

5. A signal transmission system comprising:

an input transducer comprising a diode capable of conducting current by the microplasma effect;

an output transducer comprising a low-frequency band-pass filter;

means comprising a substantially constant current source for directing a sufficient reverse-bias current through the diode to cause microplasma current conduction, whereby the diode generates a pulse train;

means for modulating reverse-bias current supplied to the diode, thereby modulating the duration and frequency of component pulses of the pulse train; and, means for transmitting the said pulse train to said output transducer.

6. The signal transmission system of claim 5 wherein:

the low-frequency band-pass filter is capable of transmitting frequencies within a bandwidth $\Delta f$; and the modulating means comprising a source of analog signals to be transmitted having a frequency within a bandwidth $\Delta f$.

7. In a signal transmission system, the combination comprising:

a diode of the type characterized by the conduction of constant amplitude current pulses when reverse biased to a voltage above a threshold level but below the level of avalanche breakdown;

means comprising a substantially constant current source for reverse biasing the diode at a voltage above the threshold level, but below the level of avalanche breakdown, whereby a train of constant amplitude pulses are generated by the diode;

and means for superimposing on the current supplied by the constant current source an analog signal current, thereby modulating the width and frequency of the constant amplitude pulses to convert the analog signal to a digital signal.

8. The combination of claim 7 wherein:

the maximum amplitude of the sum of the analog signal current and the current supplied by the constant current source is smaller than the amplitude of said current pulses.

9. The combination of claim 8 further comprising:

means comprising a low-frequency band-pass filter for converting said train of constant amplitude pulses to an analog signal.